(12) United States Patent
Lee et al.

(10) Patent No.: US 6,597,085 B2
(45) Date of Patent: Jul. 22, 2003

(54) PIEZOELECTRIC TRANSDUCER APPARATUS HAVING A MODAL-SHAPED ELECTRODE

(75) Inventors: Chih-Kung Lee, 6F, No. 3, Lane 165 Tun Hwa North Road, Taipei (TW); Wen-Hsin Hsiao, Taipei (TW); Yu-Hsiang Hsu, Taipei (TW); Chih-Wen Hsieh, Taipei (TW)

(73) Assignee: Chih-Kung Lee, Taipei (TW)

( * ) Notice: Subject to any disclaimer, the term of this patent is extended or adjusted under 35 U.S.C. 154(b) by 0 days.

(21) Appl. No.: 09/919,434

(22) Filed: Jul. 30, 2001

(65) Prior Publication Data

US 2003/0067244 A1 Apr. 10, 2003

(30) Foreign Application Priority Data

Jul. 31, 2000 (TW) ........................................ 89115305 A

(51) Int. Cl.[7] .............................................. H01L 41/08
(52) U.S. Cl. ........................ 310/366; 310/365; 310/359
(58) Field of Search ................................ 310/365, 366, 310/358, 359

(56) References Cited

U.S. PATENT DOCUMENTS

| | | | | |
|---|---|---|---|---|
| 4,193,010 A | * | 3/1980 | Kompanek | 310/330 |
| 4,392,074 A | * | 7/1983 | Kleinschmidt et al. | 310/366 X |
| 4,584,499 A | * | 4/1986 | Leskovec et al. | 310/318 |
| 4,868,447 A | * | 9/1989 | Lee et al. | 310/328 |
| 5,138,216 A | * | 8/1992 | Woodruff et al. | 310/316 |
| 5,751,092 A | * | 5/1998 | Abe | 310/359 |
| 5,814,922 A | * | 9/1998 | Uchino et al. | 310/359 |
| 5,861,704 A | * | 1/1999 | Kitami et al. | 310/369 |
| 6,188,163 B1 | * | 2/2001 | Danov | 310/366 |
| 6,278,226 B1 | * | 8/2001 | Danov et al. | 310/359 |
| 6,362,560 B1 | * | 3/2002 | Yang et al. | 310/359 |

\* cited by examiner

Primary Examiner—Mark O. Budd
(74) Attorney, Agent, or Firm—J.C. Patents

(57) ABSTRACT

An innovative piezoelectric transducer apparatus having a piezoelectric workpiece with a modal-shaped actuator electrode for converting an input energy of one form into an output energy of another form. The piezoelectric workpiece comprises an actuator section and a sensor section. The actuator section is formed in the piezoelectric workpiece and has a modal-shaped electrode for exciting the piezoelectric workpiece into mechanical vibration upon driven by the input energy. The sensor section is also formed in the piezoelectric workpiece and has a sensor electrode for delivering the output energy to an external load of the apparatus by picking up the energy generated by the excitation. The modal-shaped actuator electrode has a shape function defined by the mathematical solution function of the governing equation of the piezoelectric workpiece under the condition that the piezoelectric workpiece being vibrating in a selected resonant mode.

7 Claims, 8 Drawing Sheets

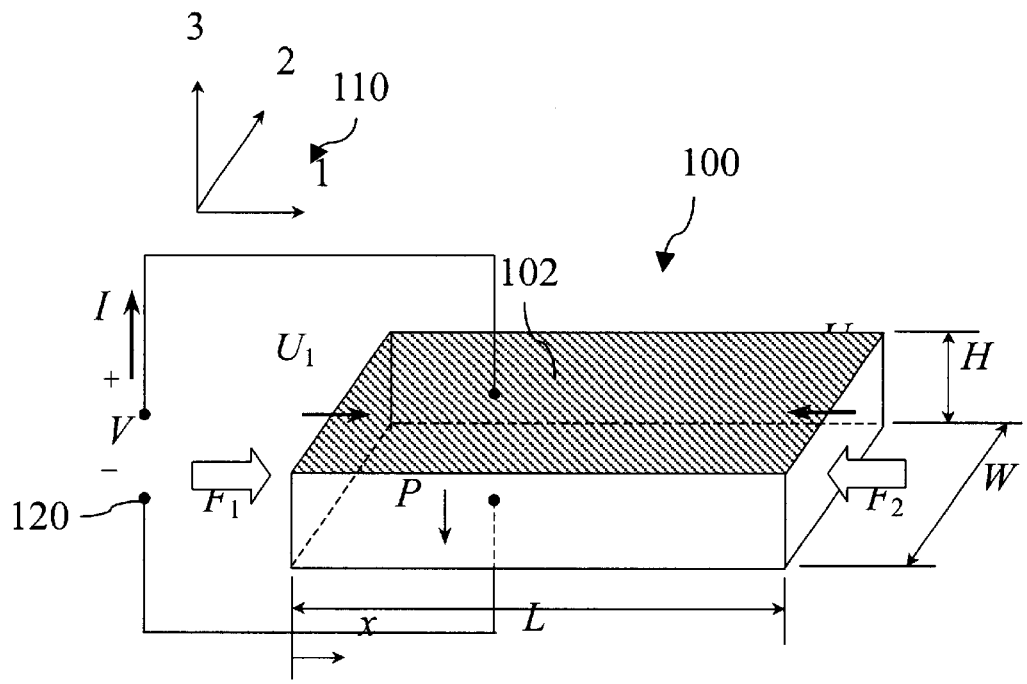
Figure 1
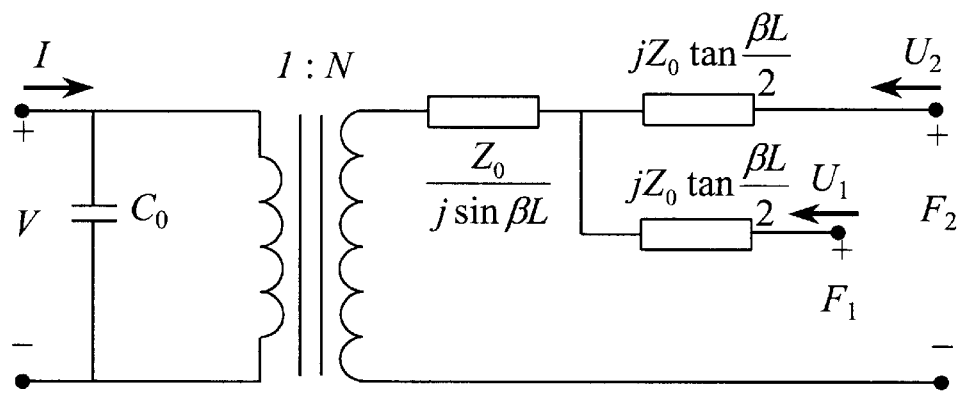
$$Z_0 = HW\sqrt{\rho c_{11}^E}$$
$$\beta = \omega/c \qquad c = \sqrt{c_{11}^E/\rho}$$
$$C_0 = (WL/H)\varepsilon_{33}^T(1-k_{31}^2) \qquad k_{31}^2 = \frac{d_{31}^2 c_{11}^E}{\varepsilon_{33}^T}$$
$$N = W d_{31} c_{11}^E$$
**Figure 2 – *Prior Art***

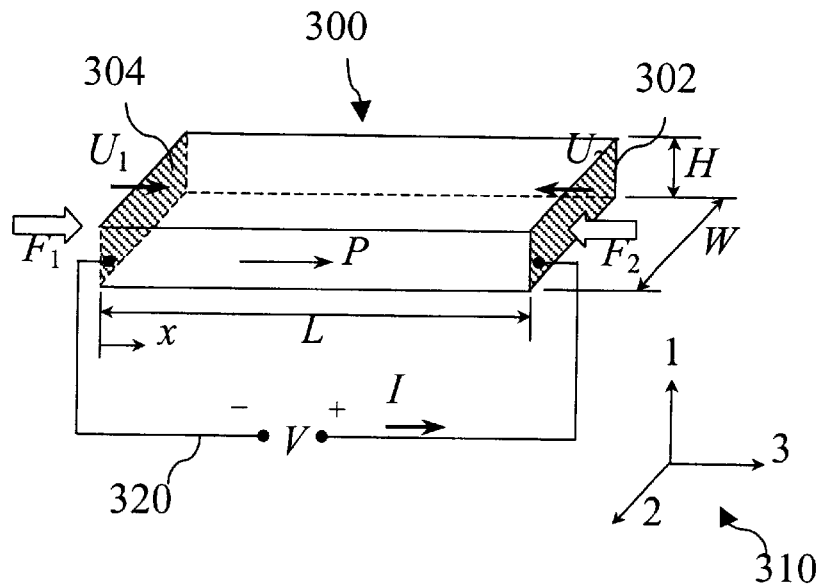
Figure 3
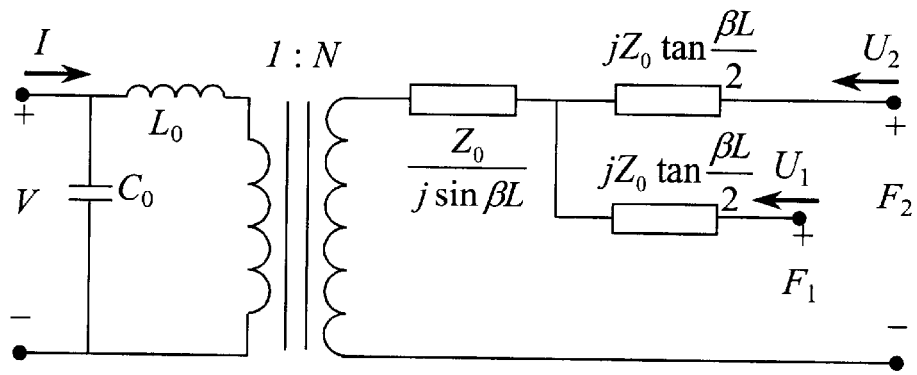
$$Z_0 = HW\sqrt{\rho c_{33}^D}$$
$$\beta = \omega / c \qquad c = \sqrt{c_{33}^D / \rho}$$
$$C_0 = (WH/L)\varepsilon_{33}^T\left(1-k_{33}^2\right) \qquad L_0 = 1/C_0 \qquad k_{33}^2 = \frac{d_{33}^2 c_{33}^E}{\varepsilon_{33}^T}$$
$$N = \frac{WHh_{33}}{L\left(\beta_{33}^T + g_{33}h_{33}\right)} = \frac{WH}{L}d_{33}c_{33}^E$$
**Figure 4 – *Prior Art***

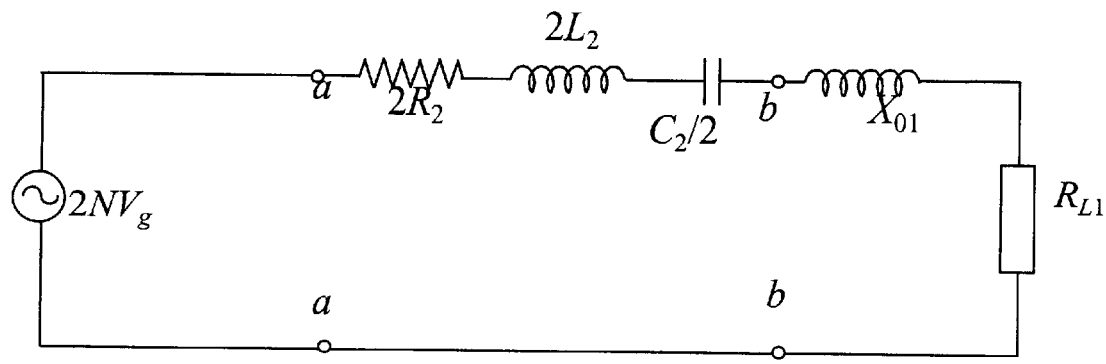
**Figure 5 - *Prior Art***
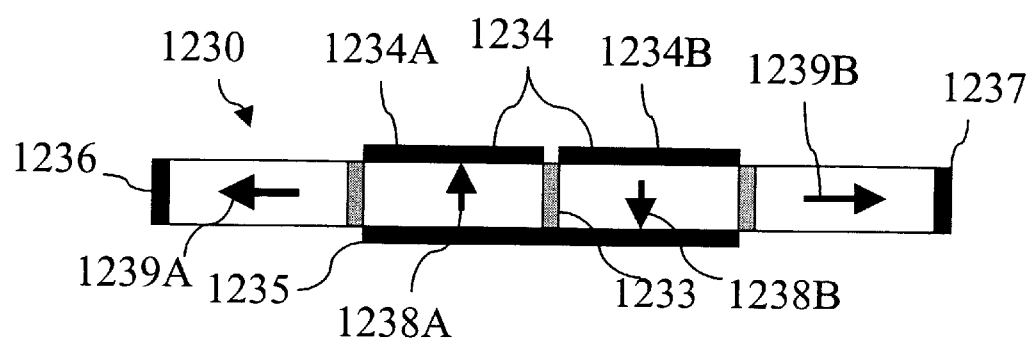
Figure 13

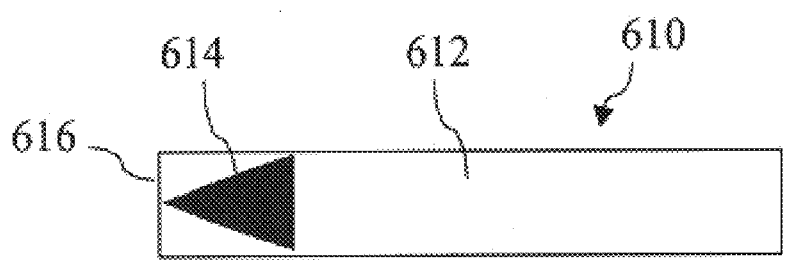
$a = 2/9$   Figure 6A
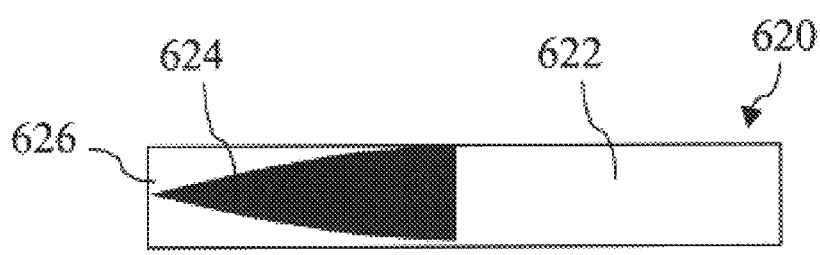
$a = 1/2$   Figure 6B
$a = 2/3$   Figure 6C

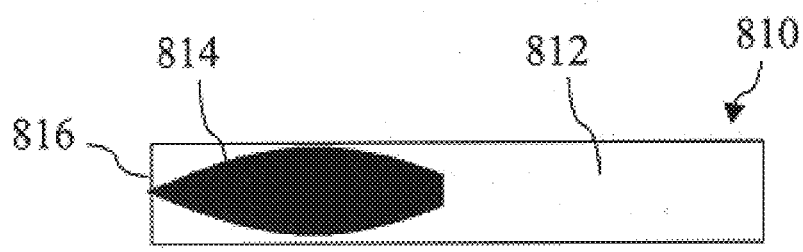
$a = 4/9$    Figure 8A
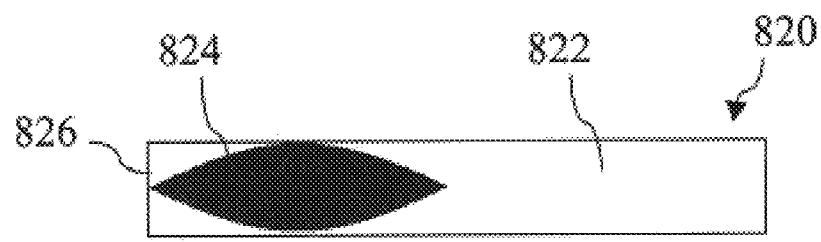
$a = 1/2$    Figure 8B
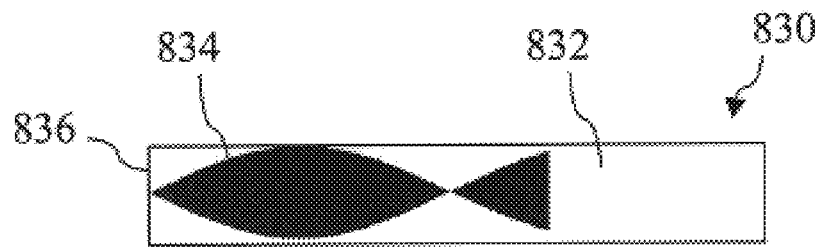
$a = 2/3$    Figure 8C

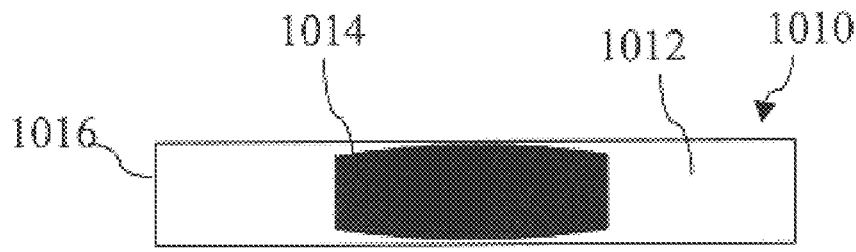
$a = 4/9$  Figure 10A
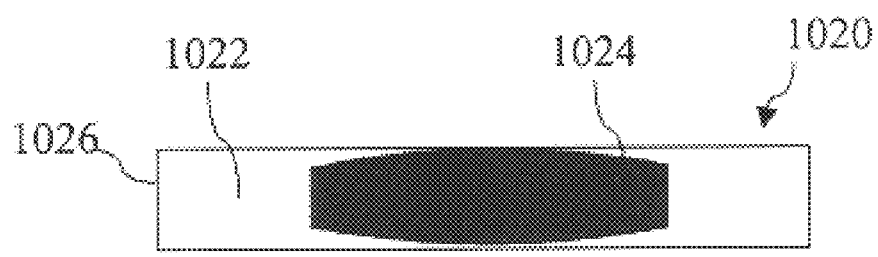
$a = 5/9$  Figure 10B
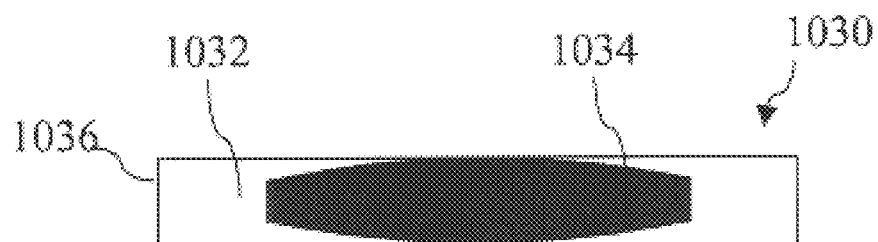
$a = 2/3$  Figure 10C

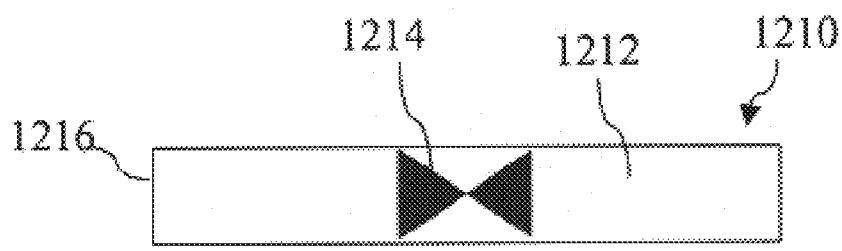
$a = 2/9$  Figure 12A
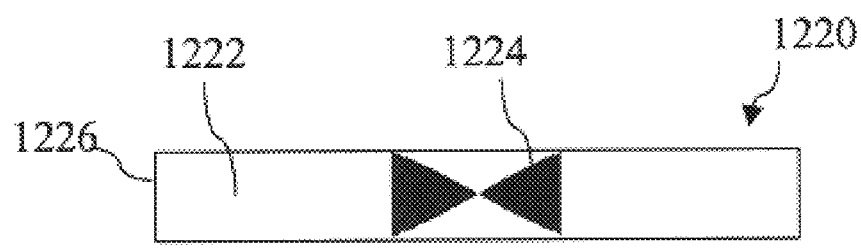
$a = 5/18$  Figure 12B
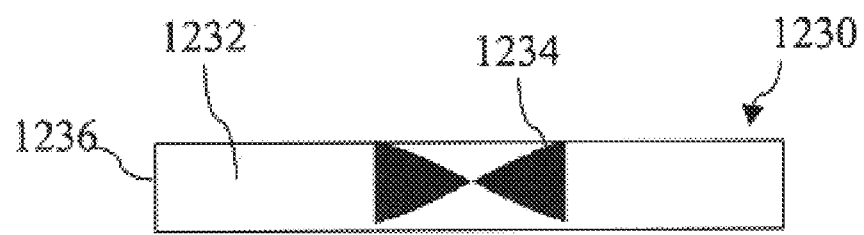
$a = 1/3$  Figure 12C

PIEZOELECTRIC TRANSDUCER APPARATUS HAVING A MODAL-SHAPED ELECTRODE

FIELD OF THE INVENTION

This invention relates in general to a piezoelectric energy conversion apparatus and, in particular, to one with high energy conversion efficiency. More particularly, this invention relates to a piezoelectric transformer having modal-shaped electrode for efficiently converting electric power.

BACKGROUND OF THE INVENTION

Piezoelectricity is widely utilized in various applications. As a transducer for converting energy in one form into another, a piezoelectric material block is useful as a workpiece for converting mechanical energy to electrical or vice versa. A piezoelectric workpiece can be used to convert an electrical power at one AC frequency and voltage into another at different frequency and voltage. This specific application of AC electrical power conversion involving converted (frequently raised) voltage makes a piezoelectric transducer device a useful piezoelectric transformer suitable for various industrial and consumer applications.

Charles A. Rosen proposed his piezoelectric transformer in the 1950's. It is not until the 1990's when piezoelectric transformer has become more and more popular in electronic devices. Piezoelectric transformers have been used such as in the power supply section of various electronic devices, portable ones in particular. Due to benefits such as their size and weight, it is obvious that piezoelectric transformers will become even more popular. Improved safety is another desirable feature of a piezoelectric transformer. A failed piezoelectric transformer normally breaks itself and ceases to function. Fire hazards are virtually of no concern at the part of the piezoelectric workpiece itself.

Electrodes plated to the surface of a piezoelectric material block are necessary for conveying electric power into and/or out of the workpiece in order for the piezoelectric system to function. Traditionally, dimensioning factors including both shape and size of the electrodes have not been carefully considered parameters when designing a piezoelectric system. Typically, rectangular-shaped electrodes are used for rectangular-shaped workpieces. In disk- or ring-shaped workpieces, electrodes are typically also disk-shaped or having the shape of a section of the disk or ring. These electrode shape configurations are considered uniform electrodes in the description of the present invention.

Traditionally, piezoelectric systems have been analyzed based on circuit theories. Mechanical considerations of a piezoelectric system are "translated" into parameters that are fit into circuit models. Piezoelectric workpieces thus developed are not optimized in issues such as energy conversion efficiency and parasitic noises—signals at undesirable frequencies with sufficiently significant amplitudes mixed in the output of a piezoelectric workpiece.

FIG. 1 is a perspective view of a piezoelectric workpiece outlining the definition of the piezoelectric parameters, both electrical and mechanical, and material orientation and dimensions for the analysis of a piezoelectric system. As is illustrated, the piezoelectric workpiece 100 is, in general, an elongated thin rectangular-shaped plate having a length L, a width W and a thickness, or height, H. Note that in the following theoretical development for the description of the piezoelectric transducer apparatus of the present invention, the IEEE Compact Matrix Notation system is employed.

By convention, the two largest surfaces of the elongated thin-plate workpiece are the side surfaces, and the two smallest are the end surfaces. The direction along the longitudinal axis of the workpiece is the first orientation, that perpendicular to the first orientation and parallel to the side surfaces is the second, and that perpendicular both to the side surfaces and to the longitudinal axis is the third, as is shown in the drawing by an orientation axis system 110 labeled with orientations 1, 2 and 3 respectively.

Also, in the theoretical development of the invention in the following detailed description, a variable x is set up along the direction of the first orientation. This coordinate axis, one measuring the longitudinal dimension, or length, of the elongated workpiece 100, serves as a variable in the analysis of the piezoelectric system according to the teaching of the present invention. One end of the workpiece 100 is set conveniently as the origin of the x coordinate axis, as is seen in FIG. 1.

The workpiece 100 has a side-plated electrode 102 and another not shown in the perspective view. That electrode which opposes electrode 102 and provides for a complete electrical circuit path is plated on the other side of the workpiece opposite to the side for the electrode 102.

Each of the electrodes is connected to a corresponding terminal of an electric circuit 120, represented in the drawing by a voltage sign V that signifies a voltage across the electrodes of the piezoelectric workpiece. The current corresponding to the voltage V in the circuit 120 is identified by I. P represents the electrical power arising from voltage V and current I.

External mechanical forces applied to the workpiece 100 is identified in the drawing by the symbol F, the corresponding mechanical velocity induced as a result of an applied force F is identified by U.

The piezoelectric system of FIG. 1, which has a workpiece 100 with side-plated electrodes including 102, is in the 31 mode, i.e., the polarization is in orientation 3, and the mechanical vibration is in orientation 1. By contrast, a system such as that illustrated in FIG. 3 which has a workpiece 300 with end-plated electrodes 302 and 304 is in 33 mode. Both its electrical polarization and mechanical vibration are along orientation 3 of its orientation axis system 310.

Based on the traditional method of analysis that relies on circuit theories, a piezoelectric system such as that depicted in FIG. 1 which has side-plated electrodes and operates in the 31 mode has the following constitutive equations:

$$S_1 = s_{11}^E T_1 + d_{31} E_3 \qquad (1)$$

$$D_3 = d_{31} T_1 + \epsilon_{33}^T E_3. \qquad (2)$$

In Equations (1), (2) and those to be discussed below, the parameters and constants are in accordance with their respective definitions in the IEEE notation system mentioned above.

Based on the relationship between the piezoelectric constants and between the longitudinal strain u and the longitudinal stress $S_1$, considering the longitudinal motion equation for the system, the following governing equation may be derived for the 31 mode piezoelectric workpiece:

$$-\rho \frac{\partial^2 u}{\partial t^2} + c_{11}^E \frac{\partial^2 u}{\partial x^2} = E_3 \frac{\partial e_{31}}{\partial x}. \qquad (3)$$

Since a conventional piezoelectric workpiece employs uniform electrodes characterized by its rectangular-shaped electrode patterns, Equation (3) may thus be reduced to:

$$-\rho\frac{\partial^2 u}{\partial t^2} + c_{11}^E \frac{\partial^2 u}{\partial x^2} = 0. \tag{4}$$

Equation (4) is a homogeneous one-dimensional wave equation, which has a general solution for the longitudinal strain u that can be expressed as $$u=(B_1 \sin \beta x + B_2 \cos \beta x)e^{j\omega t} \tag{5}$$

wherein $$\beta=\omega/c \tag{6}$$

and $$c=\sqrt{c_{11}^E/\rho}, \tag{7}$$

in which $j=\sqrt{-1}$, $\omega$ is the angular frequency, $\beta$ is the wave number, c is the velocity of wave propagation, and $B_1$ and $B_2$ are, respectively, coefficients to be determined by the boundary condition of the examined system.

In addition to the mechanical piezoelectric parameters as incorporated into the analysis above, electrical ones also need to be considered in the analysis as well. In a 31 mode piezoelectric system of FIG. 1, the electromechanical coupling coefficient can be defined to be $$k_{31}^2 = \frac{d_{31}^2 c_{11}^E}{\varepsilon_{33}^T}. \tag{8}$$

Assuming that the 31 mode piezoelectric workpiece in the system is clamped at its both ends, the mechanical characteristic impedance of the workpiece transmitting mechanical waves can be described as $$Z_0 = HW\rho c = HW\sqrt{\rho c_{11}^E}. \tag{9}$$

In a traditional analysis approach based on circuit theories, mechanical parameters of force and velocity in a piezoelectric system are considered in an analogy and treated as the equivalents of another parameter pair of voltage and current respectively. Based on such an analogy, a 31 mode piezoelectric system can be shown to have an equivalent transformer step-up ratio of $$N=Wd_{31}c_{11}^E. \tag{10}$$

FIG. 2 shows the equivalent circuit of the 31 mode piezoelectric system of FIG. 1. The circuit configuration in this equivalent circuit is obtained utilizing the conventional technique of circuit analysis as described above. Characteristics of the equivalent circuit, namely, those of a 31 mode piezoelectric transformer as defined by the system of FIG. 1 are outlined in the drawing. These include the mechanical characteristic impedance $Z_0$, the wave number $\beta$, the velocity of wave propagation c, the electromechanical coupling coefficient $k_{31}^2$, and the equivalent step-up ratio N.

Based on the same circuit theories, another piezoelectric system, one in the 33 mode as outlined in FIG. 3, may be shown to have an equivalent circuit illustrated in FIG. 4, which is derived from the following governing equation $$-\rho\frac{\partial^2 w}{\partial t^2} + c_{33}^D \frac{\partial^2 w}{\partial z^2} = 0. \tag{11}$$

To construct a piezoelectric transformer, a known method is to combine the 31 and 33 mode piezoelectric systems of FIGS. 1 and 3. In such a piezoelectric transformer, a Rosen-type piezoelectric transformer for example, the side electrodes can be used as the input terminals and the end electrodes as the output terminals. Note the same terminology of the side and end electrodes as that used in the above description of the systems of FIGS. 1 and 3. The side and end electrodes are those plated on the largest and smallest surfaces of the elongated thin-plate workpiece respectively.

Traditional circuit analysis for a Rosen-type piezoelectric transformer may be developed based on the equivalent circuits of FIGS. 2 and 4 as both are combined to construct the transformer. For example, for a Rosen-type piezoelectric transformer put to operate on its second resonant frequency, an equivalent circuit can be derived as shown in FIG. 5. However, the equivalent circuit of FIG. 5 is derived by employing a considerable level of simplifications in the process of its theoretical development. These mathematical simplifications based on physically reasonable assumptions are necessary in order to avoid a mathematical system that may become excessively complex to analyze and to seek solution.

Though, this traditional approach has at least a few drawbacks. As the mechanical parameters of a piezoelectric workpiece are incorporated into the equivalent circuit for analysis based purely on circuit theories, some critical mechanical parameters diminish or even disappear in the process. These lost characteristics of a piezoelectric system that should otherwise have been preserved in the mathematical model of the system imply less flexible or even lost design parameters. Those characteristics, if preserved, may lead to the construction of better piezoelectric systems.

For example, the system performance characteristics such as energy conversion efficiency can not be optimized. This is due to the fact that circuits interfacing with the piezoelectric workpiece including both the driving circuit and the load have to be designed by considering the circuit configuration based on the equivalent circuit of the piezoelectric workpiece. However, the equivalent circuit is not the best model of the piezoelectric body as its mechanical characteristics are not fully encompassed in circuit theory-based models.

The result obtained from the conventional circuit theory in the analysis of a piezoelectric transducer system thus is not the best possible result. This is a fact reflected by the harmonics existing in the output of a piezoelectric system constructed in accordance with the developed result. The presence of these harmonics reduces overall system efficiency, and also incurs other problems such as load matching due to the existence of the undesirable harmonics.

SUMMARY OF THE INVENTION

Accordingly, it is an object of the present invention to provide a piezoelectric transducer apparatus having a modal-shaped electrode that operates in a resonant mode without significant undesirable harmonics of non-resonant frequencies.

It is another object of the present invention to provide a piezoelectric transducer apparatus having a modal-shaped electrode that achieves high operating efficiency in converting energy.

It is a further object of the present invention to provide a piezoelectric transformer having a modal-shaped electrode that outputs an AC electric power without significant undesirable harmonics.

These and other objects are achieved in an innovative piezoelectric transducer apparatus having a piezoelectric workpiece with a modal-shaped actuator electrode for converting an input energy of one form into an output energy of another form. The piezoelectric workpiece comprises an actuator section and a sensor section. The actuator section is formed in the piezoelectric workpiece and has a modal-shaped electrode for exciting the piezoelectric workpiece into mechanical vibration upon driven by the input energy. The sensor section is also formed in the piezoelectric workpiece and has a sensor electrode for delivering the output energy to an external load of the apparatus by picking up the energy generated by the excitation. The modal-shaped actuator electrode has a shape function defined by the mathematical solution function of the governing equation of the piezoelectric workpiece under the condition that the piezoelectric workpiece being vibrating in a selected resonant mode.

BRIEF DESCRIPTION OF THE DRAWINGS

FIG. 1 is a perspective view of a piezoelectric workpiece with side-plated electrodes outlining the definition of the piezoelectric parameters and material dimensioning for the analysis of a piezoelectric system.

FIG. 2 is the equivalent circuit of the piezoelectric system of FIG. 1 obtained utilizing the prior-art technique of circuit analysis.

FIG. 3 is a perspective view of a piezoelectric workpiece with end-plated electrodes outlining the definition of the piezoelectric parameters and material dimensioning for the analysis of a piezoelectric system.

FIG. 4 is the equivalent circuit of the piezoelectric system of FIG. 3 obtained utilizing the prior-art technique of circuit analysis.

FIG. 5 is an equivalent circuit of a Rosen-type piezoelectric transformer operating at the second resonant frequency obtained utilizing the prior-art technique of circuit analysis.

FIGS. 6A, 6B and 6C illustrate patterns of the actuator electrode for a first mode edge-driving quasi-modal actuator section of a piezoelectric transformer having an electrode length ratio of 2/9, 1/2 and 2/3 respectively.

FIGS. 8A, 8B and 8C illustrate patterns of the actuator electrode for a second mode edge-driving quasi-modal actuator section of a piezoelectric transformer having an electrode length ratio of 4/9, 1/2 and 2/3 respectively.

FIGS. 10A, 10B and 10C illustrate patterns of the actuator electrode for a first mode center-driving quasi-modal actuator section of a piezoelectric transformer having an electrode length ratio of 4/9, 5/9 and 2/3 respectively.

FIGS. 12A, 12B and 12C illustrate patterns of the actuator electrode for a second mode center-driving quasi-modal actuator section of a piezoelectric transformer having an electrode length ratio of 2/9, 5/18 and 1/3 respectively.

FIG. 13 illustrates the side view of a piezoelectric transformer constructed utilizing the second mode center-driving quasi-modal actuator with an electrode pattern of FIG. 12C.

DETAILED DESCRIPTION OF THE INVENTION

Figure 7:
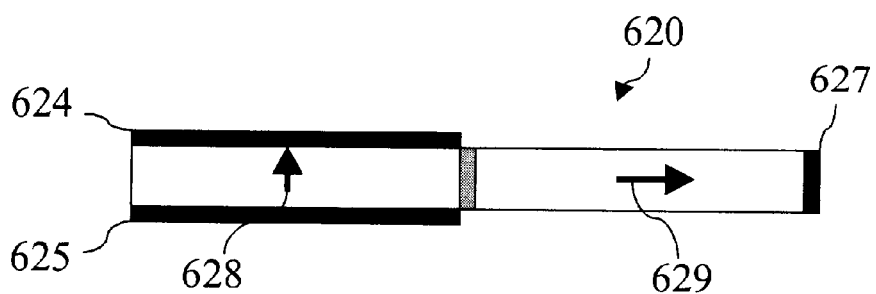
FIG. 7 illustrates the side view of a piezoelectric transformer constructed utilizing the first mode edge-driving quasi-modal actuator with an electrode pattern of FIG. 6B.

The underlying concept leading to the development of the present invention is, in summary, the added dimension of consideration in the mechanical aspect in the mathematical modeling of the piezoelectricity in energy conversion. Traditional modeling for a piezoelectric system has been concentrated on electrical circuit theories. With the mechanical characteristics of a piezoelectric workpiece incorporated into the system modeling considerations in accordance with the teaching of the present invention, the mathematical solutions to the system governing equations lead to and open up an entire new category of piezoelectric transducer devices.

The inventive piezoelectric transducer apparatuses according to the present invention are capable of substantially more efficient operation as they are used in various applications for energy conversion, including the transformation of voltage and current of AC electrical power. These innovative piezoelectric transducer devices can be characterized by having distinguished patterns for their electrodes defined by the solution of the governing equation, which has included in its establishment, in addition to the obvious electric circuit factors, those necessary mechanical considerations.

Electrodes for traditional piezoelectric workpieces have been shaped with simple geometry, such as those rectangular-shaped ones. In contrast, the electrode for the innovative piezoelectric transducer apparatuses of the present invention has the shape of mathematical functions including trigonometric functions. Electrode patterning thus becomes an additional parameter that can be conveniently manipulated for designing piezoelectric transducer apparatuses such as a piezoelectric transformer.

In accordance with the teaching of the present invention, a piezoelectric workpiece in a piezoelectric system is considered as a complete and total structure and is modeled mathematically in a set of state equations. In the state equations, characteristics of the piezoelectric system as observed from the mechanical aspect are included for detailed consideration and mathematical analysis. According to the invention, to implement the mathematical analysis of a piezoelectric system, concepts employed for the analysis of pseudo-modal piezoelectric actuators and the theory of wave propagation are incorporated into the entire modeling system.

As an embodiment of a piezoelectric transducer apparatus that can be analyzed in accordance with the teaching of the invention, consider, for example, a Rosen-type piezoelectric transformer. The transformer can be modeled by combining a 31 and a 33 mode piezoelectric workpiece similar to that of FIGS. 1 and 3 respectively. The governing equation for such a transformer can be shown to be $$-\rho \frac{\partial^2 u}{\partial t^2} + c_{11}^E \frac{\partial^2 u}{\partial x^2} = E_3^{in} \frac{\partial e_{31}}{\partial x}. \tag{12}$$

Note that in the governing equation, variable t is time and x is the longitudinal dimension for the piezoelectric workpiece, as shown in the model of FIG. 1.

Derived from the constitutive equation set of the generalized piezoelectric system, the governing Equation (12)

describes a relationship between the concerned functioning conditions in that system that is established for a sought piezoelectric workpiece. Equation (12) specifically addresses the condition for a 31 mode piezoelectric workpiece having a structural configuration of elongated thin plate. Equation (12) describes that the partial derivatives of the longitudinal strain u in time and spatial dimension are related to the partial derivative of the piezoelectric stress/charge constant $e_{k_p}$ in the spatial dimension.

Equation (12) is a standard non-homogeneous one-dimensional wave equation. The term to the right of the equal sign represents the spatial external force in the model system. In the case of the Rosen-type piezoelectric transformer, boundary conditions for the wave equation are $$F_1 e^{j\omega t} = -HW\left(c_{11}^E \frac{\partial u}{\partial x} - e_{31}(x)E_3^{in}\right)\bigg|_{x=0} = 0 \qquad (13)$$

$$\rightarrow \frac{\partial u}{\partial x}\bigg|_{x=0} = \frac{e_{31}(0)E_3^{in}(t)}{c_{11}^E}$$

and $$F_2 e^{j\omega t} = -HW\left(c_{33}^D \frac{\partial u}{\partial x} + h_{33}D_3^{out}\right)\bigg|_{x=l} = 0 \qquad (14)$$

$$\rightarrow \frac{\partial u}{\partial x}\bigg|_{x=l} = -\frac{h_{33}D_3^{out}(l,t)}{c_{33}^D}$$

wherein the effective length of the Rosen-type piezoelectric transformer is $$l=L+L_e'=L(1+\sqrt{1-k_{33}^2}). \qquad (15)$$

According to the teaching of the present invention, the piezoelectric stress/charge constant $e_{k_p}$, which presents itself as $e_{31}$ in the above governing Equation (12) (to the right of the equal sign in the equation) for the Rosen-type piezoelectric transformer system, is treated as a variable that represents an adjustable factor when designing the piezoelectric system. It becomes a design factor for piezoelectric systems (such as a Rosen-type piezoelectric transformer) that conveys the spatial weight over system parameters including the geometrical shape of the electrode and the polarization level achieved by the electrode.

Due to this additional system design parameter, or, in another perspective, an additional dimension of system consideration, a piezoelectric transducer apparatus developed via the manipulation of this additional design parameter is able to enjoy more optimized system characteristics. By contrast, in the traditional approach employed for the analysis of piezoelectric system, mathematical integration in the circuit theory-oriented considerations practically eliminates this system design factor. This will be shown in the following theoretical development of the underlying concept of the present invention. Experimental results supporting the achieved improvements are also available.

Theoretically, the analysis of a piezoelectric transducer apparatus in accordance with the teaching of the present invention calls for solving the governing equation via the approach of eigenfunction expansion. To obtain a solution to the governing Equation (12) by eigenfunction expansion, the concerned governing equation for the eigenfunction $\phi_i(x)$ can be outlined as $$\frac{d^2\varphi_i}{dx^2} + \lambda_i \varphi_i = 0, \qquad (16)$$

and the boundary conditions are $$\frac{d\varphi_i}{dx}(0) = 0 \qquad (17)$$

$$\frac{d\varphi_i}{dx}(l) = 0.$$

Based on Equation (16) and the boundary conditions specified in (17), the characteristic function (eigenfunction) $\phi_i(x)$ is found to be $$\varphi_i = \sqrt{\frac{2}{l}} \cos\sqrt{\lambda_i}\, x \qquad (18)$$

wherein the characteristic value (eigenvalue) $\lambda_i$ is $$\lambda_i = \left(\frac{i\pi}{l}\right)^2 \quad i=1,2,3\ldots \qquad (19)$$

When looking into a piezoelectric transducer apparatus from the mechanical perspective, the concept of modal filtering can be incorporated into the mathematical analysis of the system. In accordance with the present invention, it is possible to arrive at a piezoelectric apparatus that is more optimized for many desired applications when modal filtering is included in consideration. Here, modal filtering refers to the phenomenon that non-resonant frequencies in a piezoelectric system functioning in a resonant mode are substantially filtered out, which is a virtual function of frequency filtering.

When the thinking of modal filtering is included in the analysis, the first derivative of the function representing the mathematical shape of the electrodes of a piezoelectric workpiece ($\partial e_{31}/\partial x$) has to comply with the condition that the internal mode of the piezoelectric system matches that of a modal actuator. In other words, the first derivative of the electrode shape has to be one of the modal shapes at the desired mode n. This can be expressed by the following condition:

$$\frac{\partial e_{31}}{\partial x} = k\varphi_n(x) \qquad (20)$$

wherein k is a scale factor.

Here, modal shape is referring to the shape of the electrode for the piezoelectric workpiece that brings the workpiece into the resonant mode of operation. In a similar sense, a modal actuator is referring to the actuator section in a piezoelectric transformer that drives the actuator section of the transformer into the resonant mode of operation. Thus, Equation (20) specifies the condition that the piezoelectric workpiece satisfies the operating condition of being functioning in a resonant mode.

As an example, consider an edge-driving modal actuator that can be used for the construction of a Rosen-type piezoelectric transformer system. Here, note that for a complete piezoelectric transformer, there is another "sensor" section to correspond to the "actuator" section in the system. In other words, it can be envisioned that the actuator is the section that receives energy input to the piezoelectric transformer system so that the sensor can deliver the "transformed" energy to an external load.

In the edge-driving modal actuator to be examined below, the actuator can be considered to be a 31 mode piezoelectric body that has its actuating electrode formed at the edge, or end, of the elongated thin-plate workpiece. Note that in a 31 mode workpiece, the actuator electrode is formed on the side surfaces, the largest surfaces of the workpiece.

In accordance with the present invention, the shape function of the actuator electrode for an edge-driving modal actuator can be obtained by considering the above Equations (18) and (20) and outlined as follows:

$$\frac{e_{31}(x)}{e_{31}^0} = \sin\frac{n\pi x}{l}. \tag{21}$$

This resolved shape function is a trigonometric function of the variable x. As will be described in the following paragraphs, the dependent variable as determined by the trigonometric function of the lengthwise variable x of the workpiece represents the width of the electrode along the direction normal to the longitudinal axis of the workpiece.

In a modal actuator having an edge-driving electrode with the shape specified by Equation (21), the actuation of the workpiece is only possible in the designated operating mode. If the system is not driven at the selected mode, the workpiece will not be actuated at all.

It should be noted that when a modal actuator is utilized for the construction of a piezoelectric transducer system such as a piezoelectric transformer, it is not considered a true modal system. This is because of the fact that the system requires the integration of the sensor section onto the same workpiece. Due to the presence of the sensor section, there has to be reserved space on the workpiece for the sensor electrode. As a result, it is mathematically impossible to implement the full-domain integration to achieve in a true modal actuator. Less the co-existing sensor section, the actuator becomes what is referred to as a quasi-modal actuator.

An electrode length ratio a is defined as the ratio of the length of the actuator electrode to that of the entire length of the piezoelectric workpiece in the longitudinal direction. This ratio becomes another parameter for implementing the design of a piezoelectric transducer apparatus in accordance with the present invention.

Consider a piezoelectric transformer having a quasi-modal actuator operating in its first mode. Based on the characteristic Equation (18) of the system and the necessary condition of the modal actuator as outlined in Equation (20), a quasi-modal actuator in first mode should have the following electrode shape:

$$\frac{e_{31}(x)}{e_{31}^0} = \frac{\sin\frac{\pi x}{l}}{k}[H(x) - H(x - al)] \tag{22}$$

wherein a is the electrode length ratio described above and k is an adjustable scale factor defined as follows:

$$k = \sin a\pi \quad \text{if} \quad a \le \frac{1}{2} \tag{23}$$

$$k = 1 \quad \text{if} \quad a \ge \frac{1}{2}$$

The term $H(x)-H(x-al)$ in the electrode shape Equation (22) is a Heaviside Step function reflecting the fact that the workpiece can not have a full-domain integration as required by a true modal actuator.

FIGS. 6A, 6B and 6C illustrate patterns of the actuator electrode for a first mode edge-driving quasi-modal actuator section of a piezoelectric transformer having an electrode length ratio of 2/9, 1/2 and 2/3 respectively. The patterns are produced according to the corresponding electrode shape function resolved. An electrode can be considered to be formed on the surface of the piezoelectric workpiece using the width of the electrode along orientation 2 (FIG. 1) as a function of the x coordinate along orientation 1.

For example, the edge-driving actuator electrode 614 of FIG. 6A with an electrode length ratio a=2/9 can be envisioned as formed on the side surface 612 of the workpiece 610, which originates from the end 616 of the workpiece 610, and last for 2/9 the total length of the workpiece. Along orientation 2 (FIG. 1), the width of the electrode 614 is determined by the value obtained from Equation (22). It should be noted that since the analytical system is one-dimension along the x axis of orientation 1 (FIG. 1), therefore the width on orientation 2 can be scale-less so long as it conforms to the solution equation. This means that the shape of an electrode needs not be symmetrical along longitudinal axis of the workpiece, although the patterns exemplified in FIGS. 6A, 6B and 6C are symmetrical.

FIG. 7 illustrates the side view of a piezoelectric transformer constructed utilizing the first mode edge-driving quasi-modal actuator with an electrode pattern of FIG. 6B. The side view is taken along orientation 2 so that the workpiece 620 reveals its quasi-modal actuator electrode 624 only as a thin layer. The electrode 627 on the right end of the workpiece 620 is the sensor, or output electrode of the transformer system. The electrode 625 formed on the side surface opposite to that on which the actuator electrode 624 adheres to is utilized in the example as the common ground, or return path for both the actuator and the sensor electrodes.

The drawing also shows the directions of polarization for both sections of the transformer system. Specifically, the polarization direction identified by reference numeral 628 is the actuation polarization and that by 629 the sensing polarization.

The system of FIG. 6C is similar to those of FIGS. 6A and 6B except for the difference of the electrode length ratio a. As mentioned, this ratio can be used as another parameter for adjustment when designing a piezoelectric transducer system.

When a piezoelectric transformer employing a quasi-modal actuator section featuring the actuator electrode with a shape determined by Equation (22) is compared to one having a conventional uniform actuator electrode, available experimental results demonstrated improved transformer performance characteristics. Improvements were shown to include higher transformation efficiency and much less undesirable noise signals.

As another example, consider the piezoelectric transformers employing quasi-modal actuator sections operating in their second resonant mode. FIGS. 8A, 8B and 8C illustrate patterns of the actuator electrode for a second mode edge-driving quasi-modal actuator section of a piezoelectric transformer having an electrode length ratio of 4/9, 1/2 and 2/3 respectively. The patterns are produced according to the corresponding electrode shape function resolved.

For example, the edge-driving actuator electrode 824 of FIG. 8B with an electrode length ratio a 1/2 can be envisioned as formed on the side surface 822 of the workpiece 820, which originates from the end 826 of the workpiece 820, and last for one-half the total length of the workpiece.

Along orientation 2 (FIG. 1), the width of the electrode 824 is determined by the value obtained from Equation (22). Again, the width of the resolved electrode on orientation 2 (FIG. 1) is scale-less. Shape of the electrode is not necessarily symmetrical along longitudinal axis of the workpiece, although the patterns exemplified in FIGS. 8A, 8B and 8C are symmetrical.

Figure 9:
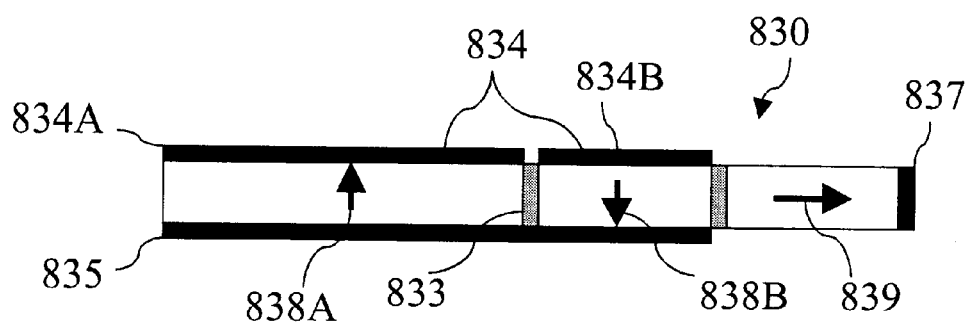
FIG. 9 illustrates the side view of a piezoelectric transformer constructed utilizing the second mode edge-driving quasi-modal actuator with an electrode pattern of FIG. 8C.

FIG. 9 illustrates the side view of the piezoelectric transformer 830 constructed utilizing the second mode edge-driving quasi-modal actuator with an electrode pattern of FIG. 8C. The side view is taken along orientation 2 (FIG. 1) in which the workpiece 830 reveals its quasi-modal actuator electrode 834 only as a thin layer. Note that the electrode 834 can be seen as comprising two sub-sections 834A and 834B. The electrode 837 on the right end of the workpiece 830 is the sensor, or output electrode of the transformer system. The electrode 835 formed on the side surface opposite to that for the actuator electrode 834 is utilized in the example as the common ground, the return path for both the actuator and the sensor electrodes.

The drawing also illustrates the directions of polarization for both the actuator and the sensor section of the transformer system. Specifically, the polarization direction identified by reference numerals 838A and 838B are the actuation polarization and that by 839 the sensing polarization. This polarization pattern in the actuator section is different from that for the first mode operation as described above. For second mode implementations in which the electrode length ratio a is greater than 1/2, two mutually reversed actuation polarizations 838A and 838B exist in the piezoelectric body. Each polarization is corresponding to the sub-section, 834A and 834B, of the actuator electrode 834. Care should be taken when implementing such designs as the phenomenon of mechanical stress concentration arises inside the piezoelectric body near the vicinity where the polarization reverses, as is in the area generally indicated by reference numeral 833 in FIG. 9.

The following resolves the electrode shape function for an edge-driving quasi-modal actuator operating in its second mode:

$$\frac{e_{31}(x)}{e_{31}^0} = \frac{\sin\frac{2\pi x}{l}}{k}[H(x) - H(x - al)] \quad (24)$$

$$k = \sin 2a\pi \quad \text{if} \quad a \leq \frac{1}{4}$$

$$k = 1 \quad \text{if} \quad a \geq \frac{1}{4}$$

Aside from the edge-driving actuator implementations described above, a different approach for placing the actuator electrode is worth examining. In center-driving designs, the resolved actuator electrode is placed at the center of the surface of the workpiece in a piezoelectric transducer system. Center-driving designs are not different from edge-driving when the governing equation is concerned. The only difference being the boundary conditions set up for the resolution of the electrode shape function.

Based on the modal shape equation as outlined in Equation (18) and the design rule equation for the electrode shape of modal actuators expressed in Equation (20), the mathematical expression representing a center-driving quasi-modal actuator operating in its first mode can be expressed as $$\frac{e_{31}(x)}{e_{31}^0} = \sin\frac{\pi x}{l}\left\{H\left[x - (1-a)\frac{l}{2}\right] - H\left[x - (1+a)\frac{l}{2}\right]\right\}. \quad (25)$$

FIGS. 10A, 10B and 10C illustrate patterns of the actuator electrode for a first mode center-driving quasi-modal actuator section of a piezoelectric transformer having an electrode length ratio of 4/9, 5/9 and 2/3 respectively. Note that in a center-driving quasi-modal actuator, the shape function puts the electrode at the center of the side surface of the elongated thin-plate workpiece along the longitudinal axis, namely, x coordinate along orientation 1.

Figure 11:
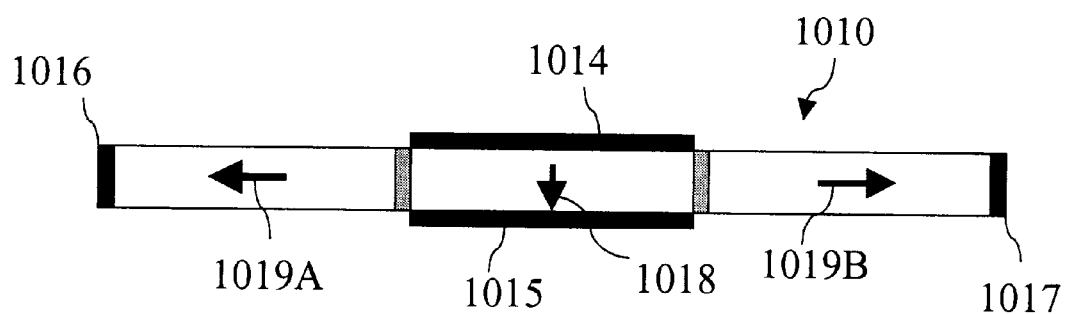
FIG. 11 illustrates the side view of a piezoelectric transformer constructed utilizing the first mode center-driving quasi-modal actuator with an electrode pattern of FIG. 10A.

FIG. 11 illustrates the side view of a piezoelectric transformer constructed utilizing the first mode center-driving quasi-modal actuator with an electrode pattern of FIG. 10A. In the case of a piezoelectric transformer system constructed utilizing a first mode center-driving quasi-modal actuator section such as that illustrated in FIG. 10A, the corresponding sensor section of the system may utilize a pair of end-plated electrodes, such as 1016 and 1017 in the side view. Note the respective polarization directions for the actuator, 1018, and sensor sections, 1019A and 1019B, respectively. Also note that the entire system as viewed in FIG. 11 is symmetrical with respect to orientation 2 (FIG. 1) of the workpiece 1010.

The following shape function resolves the electrode shape for a center-driving quasi-modal actuator operating in its second mode:

$$\frac{e_{31}(x)}{e_{31}^0} = \frac{\sin\frac{2\pi x}{l}}{k}\left\{H\left[x - (1-a)\frac{l}{2}\right] - H\left[x - (1+a)\frac{l}{2}\right]\right\} \quad (26)$$

wherein $$k = \sin(1-a)\pi \quad \text{if} \quad a \leq \frac{1}{2} \quad (27)$$

$$k = 1 \quad \text{if} \quad a \geq \frac{1}{2}$$

FIGS. 12A, 12B and 12C illustrate patterns of the actuator electrode for a second mode center-driving quasi-modal actuator section of a piezoelectric transformer having an electrode length ratio of 2/9, 5/18 and 1/3 respectively. In these center-driving quasi-modal actuator operating at second mode, as are in the case of FIGS. 10A, 10B and 10C, the shape function positions the electrode at the center of the side surface of the elongated thin-plate workpiece along the longitudinal axis, i.e., x coordinate along orientation 1.

FIG. 13 illustrates the side view of a piezoelectric transformer constructed utilizing the second mode center-driving quasi-modal actuator with an electrode pattern of FIG. 12C. If a piezoelectric transformer system is constructed utilizing a second mode center-driving quasi-modal actuator section such as that illustrated in FIG. 12C, the corresponding sensor section of the system may utilize a pair of end-plated electrodes, 1236 and 1237 in the side view. Note the respective polarization directions for the actuator, 1238A and 1238B, and sensor sections, 1239A and 1239B, respectively. Meanwhile, the entire system as viewed in FIG. 13 is symmetrical with respect to orientation 2 (FIG. 1) of the workpiece 1230.

The above examples of the inventive piezoelectric transformer systems of the present invention are superior in performance than the conventional transformers with uniform electrodes. Notably, significantly less undesirable harmonics are present in the output of the piezoelectric systems. For example, in a center-driving piezoelectric transformer of the invention, the system does not function in even modes if the assigned mode of operation is odd. In contrast, if a center-driving transformed is operated in an even mode, the workpiece will not be driven into any odd mode. This substantially reduces the noise harmonics. In turn, the overall operating efficiency is improved as well.

The solutions resolved for the shape of the actuator electrodes for the piezoelectric transducer apparatuses of the present invention, as outlined, are trigonometric functions. This is because the governing equation for the piezoelectric workpiece based on an elongated thin-plate configuration is a second order partial differential equation. If the basic structural configuration of the piezoelectric workpiece is changed into other forms, the resolved shape function will also be different, not necessarily be trigonometric function.

On the other hand, typical sensor electrode for a piezoelectric transducer apparatus in accordance with the present invention may be a conventional uniform sensor electrode, for example, one with a rectangular shape. This is convenient as, in many occasions such as in a Rosen-type piezoelectric transformer, the sensor electrode in accordance with the present invention is plated on the small end surface(s) of an elongated thin-plate piezoelectric workpiece.

While the above is a full description of the specific embodiments, various modifications, alternative constructions and equivalents may be used. For example, although piezoelectric workpieces having the structural configuration of an elongated thin plate are used as example for the theoretical development of the underlying principle of the present invention, use of workpieces of other physical dimensions are possible. For example, a piezoelectric workpiece in the shape of a thin and circular disk can be considered mathematically as a one-dimensional device in the polar coordinate system and analyzed in accordance with the teaching of the present invention. Therefore, the above description and illustrations should not be taken as limiting the scope of the present invention which is defined by the appended claims.

What is claimed is:

1. A piezoelectric transformer having a piezoelectric workpiece for converting an input electrical power of one voltage into an output electrical power of another voltage, said piezoelectric workpiece is an elongated thin plate comprising:

an actuator section formed in said piezoelectric workpiece having a modal-shaped electrode for exciting said piezoelectric workpiece into mechanical vibration upon driven by said input electrical power, and a sensor section formed in said piezoelectric workpiece having a sensor electrode for delivering said output electrical power to an external load of said transformer by picking up the power generated by said exciting, wherein:

said modal-shaped actuator electrode having a shape function defined by the mathematical solution function $$\frac{e_{31}(x)}{e_{31}^0} = \sin\frac{n\pi x}{l}$$

of the governing equation $$-\rho\frac{\partial^2 u}{\partial t^2} + c_{11}^E\frac{\partial^2 u}{\partial x^2} = E_3^{in}\frac{\partial e_{31}}{\partial x}$$

of said piezoelectric workpiece under the condition $$\frac{\partial e_{31}}{\partial x} = k\varphi_n(x)$$

that said piezoelectric workpiece being vibrating in a selected resonant mode, wherein $e_{31}$ is the piezoelectric stress/charge constant;
u is the longitudinal strain function;
$\phi_i(x)$ is the characteristic function;
l is the effective length;
x is the longitudinal dimension variable;
t is the time variable;
k is a scale factor; and
n is the selected resonant mode of operation.

2. A piezoelectric transformer having a piezoelectric workpiece for converting an input electrical power of one voltage into an output electrical power of another voltage, said piezoelectric workpiece is an elongated thin plate comprising:

an actuator section formed in said piezoelectric workpiece having a modal-shaped electrode for exciting said piezoelectric workpiece into mechanical vibration upon driven by said input electrical power, and a sensor section formed in said piezoelectric workpiece having a sensor electrode for delivering said output electrical power to an external load of said transformer by picking up the power generated by said exciting, wherein:

said modal-shaped actuator electrode having a shape function defined by the mathematical solution function $$\frac{e_{31}(x)}{e_{31}^0} = \frac{\sin\frac{\pi x}{l}}{k}[H(x) - H(x-al)]$$

wherein $$k = \sin a\pi \quad \text{if} \quad a \leq \frac{1}{2}$$

$$k = 1 \quad \text{if} \quad a \geq \frac{1}{2}$$

of the governing equation $$-\rho\frac{\partial^2 u}{\partial t^2} + c_{11}^E\frac{\partial^2 u}{\partial x^2} = E_3^{in}\frac{\partial e_{31}}{\partial x}$$

of said piezoelectric workpiece under the condition $$\frac{\partial e_{31}}{\partial x} = k\varphi_n(x)$$

that said piezoelectric workpiece being vibrating in the first resonant mode, wherein $e_{31}$ is the piezoelectric stress/charge constant;

u is the longitudinal strain function;

$\phi_i(x)$ is the characteristic function;

l is the effective length;

x is the longitudinal dimension variable;

t is the time variable;

k is a scale factor;

n is the selected resonant mode of operation;

a is the electrode length ratio; and $H(x)-H(x-al)$ is Heaviside Step function.

3. The piezoelectric transformer of claim 2, wherein said actuator electrode is formed at an edge of the longitudinal axis of said elongated thin plate.

4. A piezoelectric transformer having a piezoelectric workpiece for converting an input electrical power of one voltage into an output electrical power of another voltage, said piezoelectric workpiece is an elongated thin plate comprising:

an actuator section formed in said piezoelectric workpiece having a modal-shaped electrode for exciting said piezoelectric workpiece into mechanical vibration upon driven by said input electrical power, and a sensor section formed in said piezoelectric workpiece having a sensor electrode for delivering said output electrical power to an external load of said transformer by picking up the power generated by said exciting, wherein:

said modal-shaped actuator electrode having a shape function defined by the mathematical solution function $$\frac{e_{31}(x)}{e_{31}^0} = \frac{\sin\frac{2\pi x}{l}}{k}[H(x) - H(x - al)]$$

$$k = \sin 2a\pi \quad \text{if} \quad a \leq \frac{1}{4}$$

$$k = 1 \quad \text{if} \quad a \geq \frac{1}{4}$$

of the governing equation $$-\rho\frac{\partial^2 u}{\partial t^2} + c_{11}^E\frac{\partial^2 u}{\partial x^2} = E_3^{in}\frac{\partial e_{31}}{\partial x}$$

of said piezoelectric workpiece under the condition $$\frac{\partial e_{31}}{\partial x} = k\varphi_n(x)$$

that said piezoelectric workpiece being vibrating in the second resonant mode, wherein $e_{31}$ is the piezoelectric stress/charge constant;

u is the longitudinal strain function;

$\phi_i(x)$ is the characteristic function;

l is the effective length;

x is the longitudinal dimension variable;

t is the time variable;

k is a scale factor;

n is the selected resonant mode of operation;

a is the electrode length ratio; and $H(x)-H(x-al)$ is Heaviside Step function.

5. The piezoelectric transformer of claim 4, wherein said actuator electrode is formed at an edge of the longitudinal axis of said elongated thin plate.

6. A piezoelectric transformer having a piezoelectric workpiece for converting an input electrical power of one voltage into an output electrical power of another voltage, said piezoelectric workpiece is an elongated thin plate comprising:

an actuator section formed in said piezoelectric workpiece having a modal-shaped electrode for exciting said piezoelectric workpiece into mechanical vibration upon driven by said input electrical power, and a sensor section formed in said piezoelectric workpiece having a sensor electrode for delivering said output electrical power to an external load of said transformer by picking up the power generated by said exciting, wherein:

said modal-shaped actuator electrode having a shape function defined by the mathematical solution function $$\frac{e_{31}(x)}{e_{31}^0} = \frac{\sin\frac{2\pi x}{l}}{k}\left\{H\left[x - (1-a)\frac{l}{2}\right] - H\left[x - (1+a)\frac{l}{2}\right]\right\}$$

$$k = \sin(1-a)\pi \quad \text{if} \quad a \leq \frac{1}{2}$$

$$k = 1 \quad \text{if} \quad a \geq \frac{1}{2}$$

of the governing equation $$-\rho\frac{\partial^2 u}{\partial t^2} + c_{11}^E\frac{\partial^2 u}{\partial x^2} = E_3^{in}\frac{\partial e_{31}}{\partial x}$$

of said piezoelectric workpiece under the condition $$\frac{\partial e_{31}}{\partial x} = k\varphi_n(x)$$

that said piezoelectric workpiece being vibrating in the second resonant mode, wherein $e_{31}$ is the piezoelectric stress/charge constant;

u is the longitudinal strain function;

$\phi_i(x)$ is the characteristic function;

l is the effective length;

x is the longitudinal dimension variable;

t is the time variable;

k is a scale factor;

n is the selected resonant mode of operation;

a is the electrode length ratio; and $H(x)-H(x-al)$ is Heaviside Step function.

7. The piezoelectric transformer of claim 6, wherein said actuator electrode is formed at the center of the longitudinal axis of said elongated thin plate.

\* \* \* \* \*